United States Patent [19]

Sawaya

[11] Patent Number: 5,136,827
[45] Date of Patent: Aug. 11, 1992

[54] WRAPPING MEMBER FOR SEMICONDUCTOR DEVICE AND METHOD FOR MANUFACTURING THE WRAPPING MEMBER

[75] Inventor: Hiromichi Sawaya, Kawasaki, Japan

[73] Assignee: Kabushiki Kaisha Toshiba, Kawasaki, Japan

[21] Appl. No.: 595,771

[22] Filed: Oct. 12, 1990

Related U.S. Application Data

[63] Continuation of Ser. No. 373,810, Jun. 29, 1989, abandoned.

[30] Foreign Application Priority Data

Jul. 6, 1988 [JP] Japan ............................ 63-166802

[51] Int. Cl.⁵ ............................................. B65D 73/02
[52] U.S. Cl. ........................................ 53/453; 206/330
[58] Field of Search ............... 206/330, 332, 329, 328; 53/453, 454, 559, 560, 561, 449, 172, 175

[56] References Cited

U.S. PATENT DOCUMENTS

| | | | |
|---|---|---|---|
| 4,156,751 | 5/1979 | Yenni, Jr. et al. | 206/332 X |
| 4,223,512 | 9/1980 | Buchner | 53/453 |
| 4,702,788 | 10/1987 | Okui | 206/330 X |
| 4,712,675 | 12/1987 | Scholten et al. | 206/332 |
| 4,724,958 | 2/1988 | Kaneko et al. | 206/330 |
| 4,736,841 | 4/1988 | Kameko et al. | 206/332 |
| 4,790,433 | 12/1988 | Raszewski | 206/329 |
| 4,792,042 | 12/1988 | Koehn et al. | 206/328 |

OTHER PUBLICATIONS

European Search Report, EP 89 11 2268, Oct. 24, 1990, and Annex to European Search Report, Oct. 24, 1990.

Primary Examiner—Paul T. Sewell
Assistant Examiner—Jacob K. Ackun, Jr.
Attorney, Agent, or Firm—Finnegan, Henderson, Farabow, Garrett and Dunner

[57] ABSTRACT

A wrapping member for holding semiconductor devices comprises a carrier tape and a seal tape. The carrier tape is embossed to form depressed portions, each of which is adapted to receive one semiconductor device. The seal tape is adhered to the carrier tape in a manner to successively cover the depressed portions. A thin metallic film is formed on the surface of at least one of the carrier tape and the seal tape.

1 Claim, 8 Drawing Sheets

WRAPPING MEMBER FOR SEMICONDUCTOR DEVICE AND METHOD FOR MANUFACTURING THE WRAPPING MEMBER

This application is a continuation of application Ser. No. 07/373,810, filed Jun. 29, 1989, now abandoned.

BACKGROUND OF THE INVENTION

1. Field of the Invention

The present invention relates to a tape member for holding semiconductor devices of a surface mount type at intervals in the lengthwise direction of the tape member.

2. Description of the Related Art

Usually, ICs of a surface mount type are shipped from a factory to the user in large quantities. In some cases, hundreds of ICs to tens of thousands of ICs are transported to the user. To protect the ICs during transportation, they are wrapped up with a tape member while being spaced from one another.

Figure 3A:
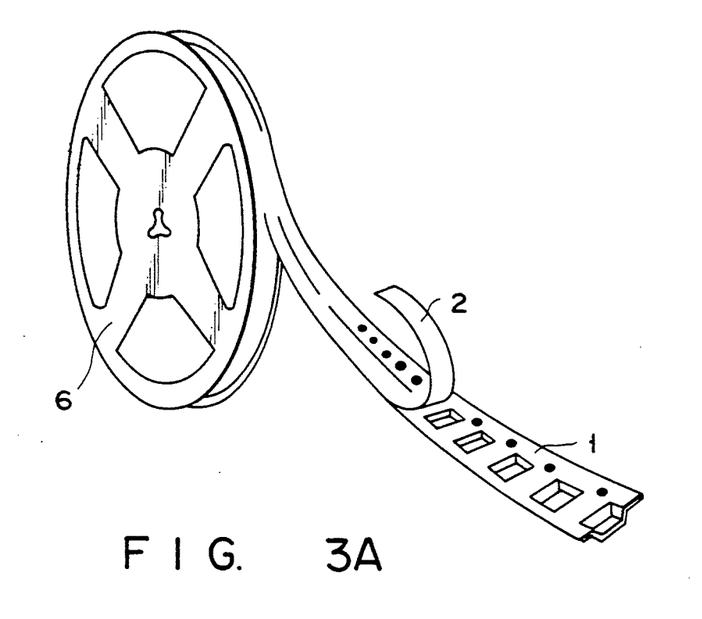
FIGS. 3A, 3B, and 3C are perspective, sectional, and plan views, respectively, of a tape member for semiconductor devices, to which the present invention is not applied.
Figure 3B:
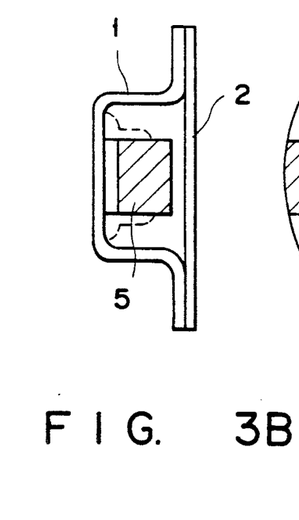
Figure 3C:
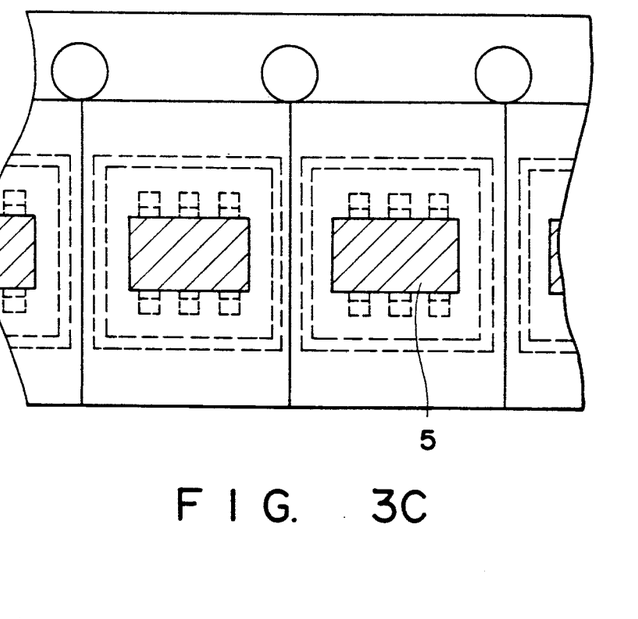

An example of a tape member is shown in FIGS. 3A, 3B and 3C. As is shown, the tape member comprises about 300 μm-thick carrier tape 1 which is formed of an organic material, such as vinyl chloride resin or polyimide, and has a plurality of depressed sections arranged in the lengthwise direction thereof; and seal tape 2 which is formed of the same organic material as carrier tape 1 and has a thickness of about 50 to 100 μm. After being manufactured in the factory, the ICs are tested to eliminate defective ones, and only those ICs which have passed the check are inserted into the respective depressed sections of the tape member one by one. After the ICs are inserted into the depressed sections, the depressed sections are covered with seal tape 2 and are then sealed by thermocompression bonding. Before being transported to the user, the sealed ICs are subjected to a durability and moisture resistance test. In this test, the ICs are left for about 20 hours in an environment whose temperature is 85° C. and whose humidity is, for example, 85%, to thereby detect whether or not the resin portions and the semiconductor chips of the ICs crack. If test is OK, the tape member, in which the ICs are sealed, is wound around reel 6. It should be noted that the tape member formed of the above organic material does not have satisfactory thermal resistance, moisture resistance or radiation resistance. Therefore, the tape member is sealed within an aluminum case after it is wound around reel 6. In this condition, the ICs are transported to the user.

As mentioned above, the tape member does not have satisfactory thermal resistance, moisture resistance or radiation resistance, and is therefore sealed in an aluminum case. Even if the user needs only several ICs, he or she has to open the aluminum case, with the result that all ICs sealed in the aluminum case are exposed to both radiation and moisture. Therefore, it is likely that the ICs will be adversely affected by radiation. It is also likely that the ICs will absorb moisture of the atmosphere, in addition to the moisture absorbed therein at the time of the moisture resistance test. If an excessive amount of moisture is contained in the ICs, it will evaporate when the ICs are mounted on a board by soldering, thus adversely affecting the internal structure of the ICs. In addition, the resin portions of the ICs may crack, or bonding pads (formed of aluminum or the like) may corrode, resulting in electrical disconnection. Where ICs are exported to transport them to a user in a foreign country, the case containing the ICs has to be opened at the customs. If the case is opened, the ICs in the case will be exposed to radiation or moisture before they are delivered to the user. It should be also noted that the tape member formed of an organic material does not have a sufficient mechanical strength, and should be therefore handled carefully during transportation.

To solve the above problems, a packing operation is required on the part of the user. This packing operation is very troublesome for the user since the ICs have to be left for 20 hours at a temperature of about 150° C., or for 48 hours at a temperature of about 70° C. Further, there is a growing tendency to employ thinner IC envelopes, so as to enable ICs to be mounted on a board at a high density. Under the circumstances, the development of tape members free from resin cracks or semiconductor chip cracks has been demanded in the art.

SUMMARY OF THE INVENTION

Accordingly, an object of the present invention is to provide a wrapping member for semiconductor devices, which does not absorb moisture, is excellent in mechanical strength, thermal resistance and radiation resistance, does not require a special management step on the part of the user, and has a wide range of application.

To achieve this object, the present invention provides a wrapping member for wrapping or packaging or taping semiconductor devices, which comprises: embossed carrier tape (1) formed of a first organic material and having a plurality of depressed portions arranged in the lengthwise direction of the carrier tape; and seal tape (2) for covering the depressed portions of the carrier tape. At least one of the carrier tape (1) and the seal tape (2) has a thin film (3, 4) formed of a metallic material.

As noted above, the tape member of the present invention comprises a thin metallic film formed on the surface of at least one of the carrier tape (1) and the seal tape (2). Therefore, the tape member does not permit moisture or radiation to pass therethrough. In addition, the tape member has high resistance against impact and heat and has a wide range of application.

DETAILED DESCRIPTION OF THE PREFERRED EMBODIMENTS

An embodiment of the present invention may now be described, with reference to the accompanying drawings.

FIGS. 1A, 1B, 1C, 2A, and 2B illustrate a tape member for semiconductor devices according to the first embodiment of the present invention. Referring to the Figures, carrier tape 1 is formed of an organic material, such as carbon-containing vinyl chloride plastics or polyimide, and has a thickness of about 300 μm. Carrier tape 1 has a plurality of independent depressed portions formed on one side thereof and arranged at regular intervals in the lengthwise direction. The depressed portions are adapted to receive ICs of a surface mount type therein. A thin aluminum film having a thickness of about 100 μm is formed, by laminating, on that side of tape 1 which is opposite to the side on which the depressed portions are formed. The thickness of the thin aluminum film may be from 5 to 10 μm.

Figure 1A:
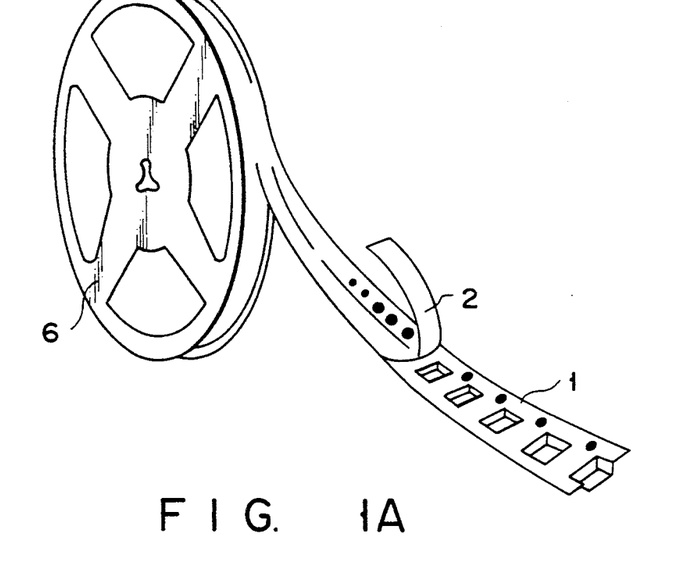
FIGS. 1A, 1B, and 1C are perspective, sectional, and plan views, respectively, of a tape member for semiconductor devices according to the first embodiment of the present invention.
Figures 1B, 1C:
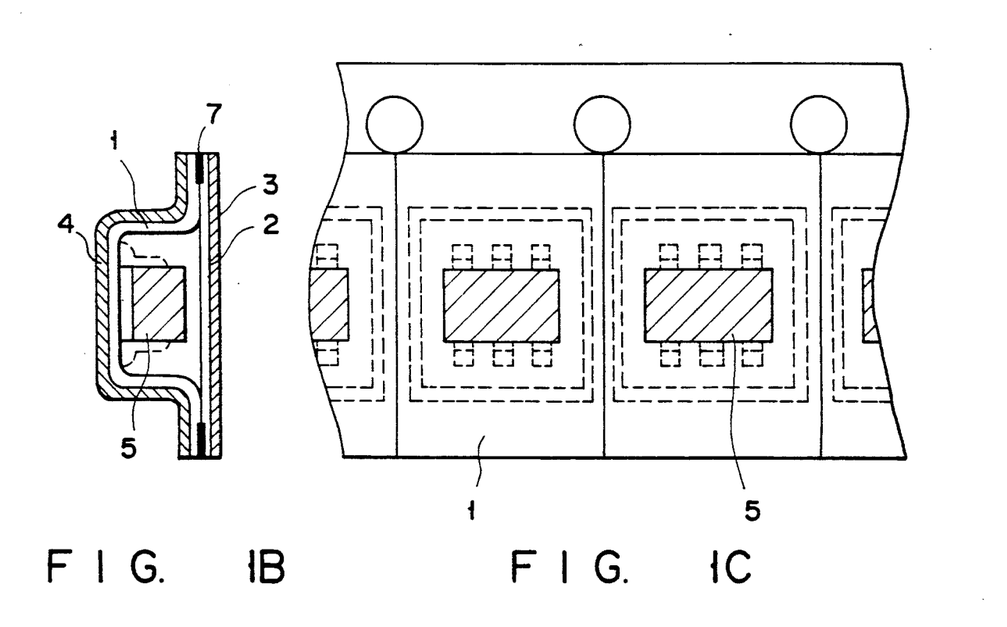

The depressed portions of carrier tape 1 are covered with seal tape 2. This seal tape is formed of polyethylene and has a thickness of about 50 to 100 μm. Thin aluminum film 3 having a thickness of about 50 to 100 μm is formed, by laminating, on that side of tape 2 which is opposite to the side used for covering the depressed portions.

ICs 5 which have been manufactured are inserted in respective depressed portions of carrier tape 1 in such a manner that the lower side of each IC 5 (from which a lead is extended) faces the bottom of each depressed portion. Thereafter, seal tape 2 is laid over carrier tape 1 in a manner to cover the depressed portions. Those portions of seal tape 2 which are to be adhered to carrier tape 1 are coated with an adhesive beforehand. Therefore, carrier tape 1 and seal tape 2 can be easily adhered to each other by use of a thermocompression device. The tape member having ICs 5 sealed therein is wound around reel 6. In this condition, the tape member containing ICs 5 therein is transported to the user, with no need to seal it in an aluminum case.

In the case of the above embodiment, those portions of the tape member which are to be exposed to the atmosphere are all covered with a laminated aluminum film. Therefore, the ICs in the taping member are completely shielded from the moisture in the atmosphere.

Figure 5:
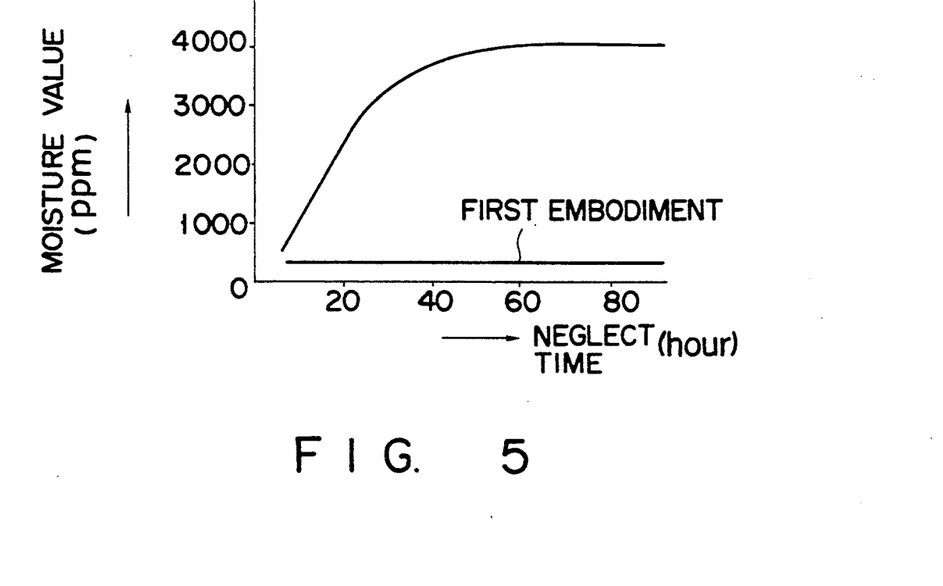
FIG. 5 is a graph showing the relationship between the moisture value and shelf time with respect to both the tape member of the first embodiment and the tape member to which the present invention is not applied.
Figure 6:
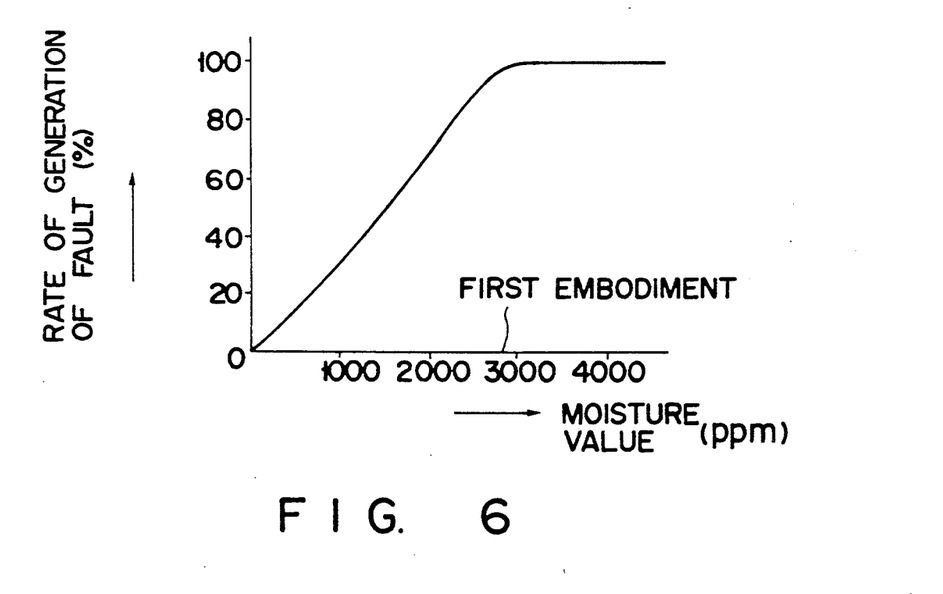
FIG. 6 is a graph showing the relationship between the defect occurring rate and the moisture value with respect to both the tape member of the first embodiment and the tape member to which the present invention is not applied.

FIGS. 5 and 6 are graphs showing results of a test actually conducted by the inventors. In the test, tape members having ICs sealed therein were left for a certain time in an environment having a predetermined humidity. As can be understood from FIG. 5, the tape members absorbed moisture with time. After the tape members were left in the above-noted environment for 60 hours, their moisture content was 4,000 ppm, resulting in moisture saturation. In contrast, the tape members of the embodiment had a laminated aluminum film, so that they did not absorb moisture. Further, as can be understood from the FIG. 6 graph (in which the defect occurring rate is plotted against the moisture content), the defect occurring rate regarding the tape member increased with an increase in the moisture content. Specifically, the defect occurring rate was almost 100% (i.e., defects such as resin cracks occurred in almost all conventional tape members) at a moisture content of 3,000 ppm. In the case of the tape members of the present invention, in contrast, the rate of the occurrence of defects (such as resin cracks) was constantly 0% since the tape members of the embodiment did not absorb moisture at all. Unlike the tape members, therefore, the tape members of the embodiment do not have to be sealed in an aluminum case. Further, even if only one IC is picked up for use, this does not expose the remaining ICs to moisture. Therefore, it is not necessary for the user to perform a packing operation. With respect to the tape members, both the moisture resistance test and the thermal resistance test were necessary, so as to cope with the situation wherein the tape members absorb moisture. In the case of the present invention, such tests need not be performed since the tape members of the present invention do not absorb moisture. In addition, the tape members of the present invention have high resistance against heat, radiation and impact. Moreover, even if only one IC is picked up for use, the remaining ICs are not adversely affected by this. Therefore, the packing operation need not be performed before the tape members of the present invention are kept in custody.

Figure 2A:
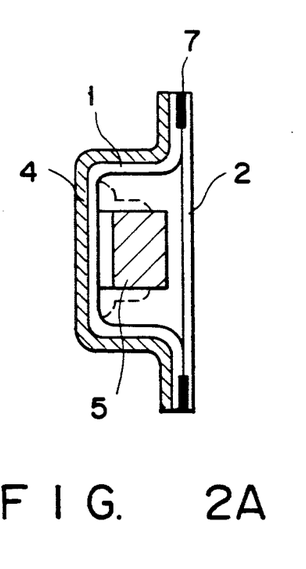
FIGS. 2A and 2B are sectional views showing the other embodiment of the present invention.

FIG. 2A illustrates a modification of the first embodiment mentioned above. This modification differs from the first embodiment, in that a laminated aluminum film is formed only on carrier tape 1.

The tape member according to this modification not only enjoys substantially the same technical advantages as the first embodiment, but also provides the following additional advantage. Since the seal tape of the modification does not have a laminated metallic film thereon, it is transparent Therefore, the user can observe the ICs sealed in the tape member, or can readily know which portion of the tape member is used or unused. Further, the tape members of the modification can be manufactured at a low cost since a laminated film is formed only on the carrier tape. The tape members of the modification are suitable for use in an environment where very high moisture and thermal resistances are not required.

Figure 2B:
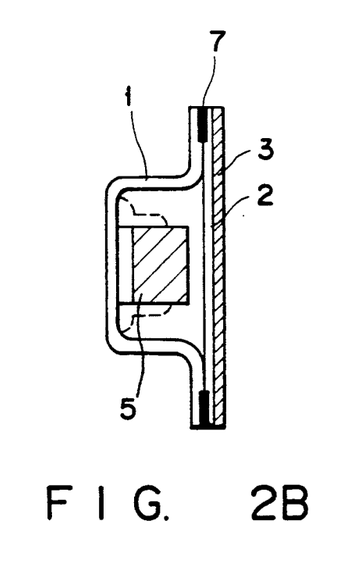

In the above embodiment and its modification, a laminated aluminum film is formed at least on the carrier tape. However, the laminated aluminum film may be formed on the seal tape alone, as is shown in FIG. 2B. This construction also produces substantially similar technical advantages as are achieved by the modification shown in FIG. 2A. Further, even if an ordinary aluminum film is formed, in place of the laminated aluminum film, substantially similar technical advantages are achieved.

Figure 1D:
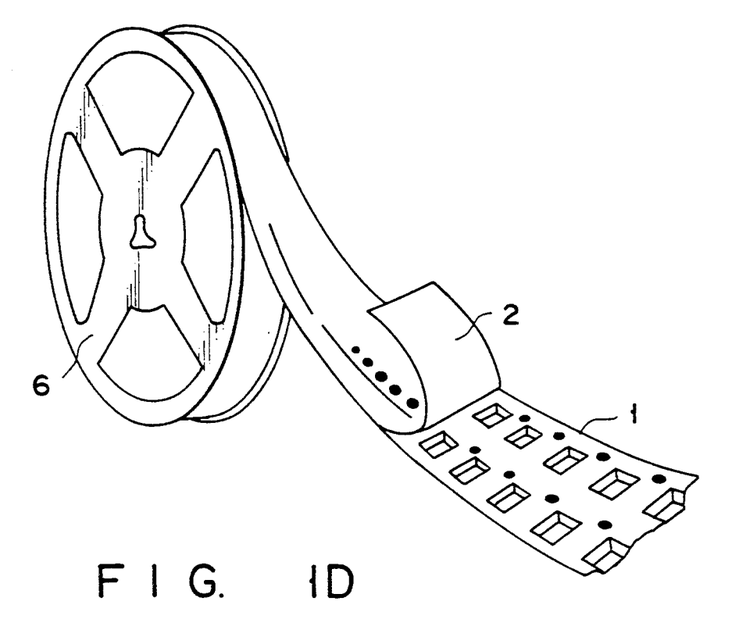
FIG. 1D is a perspective view of a tape member according to a modification of the first embodiment, on which depressed portions are arranged in a plurality of lines.

If necessary, the tape member of the present invention may comprise depressed portions arranged in a plurality of lines, for example in two lines, as is shown in FIG. 1D.

Figures 7A, 7B:
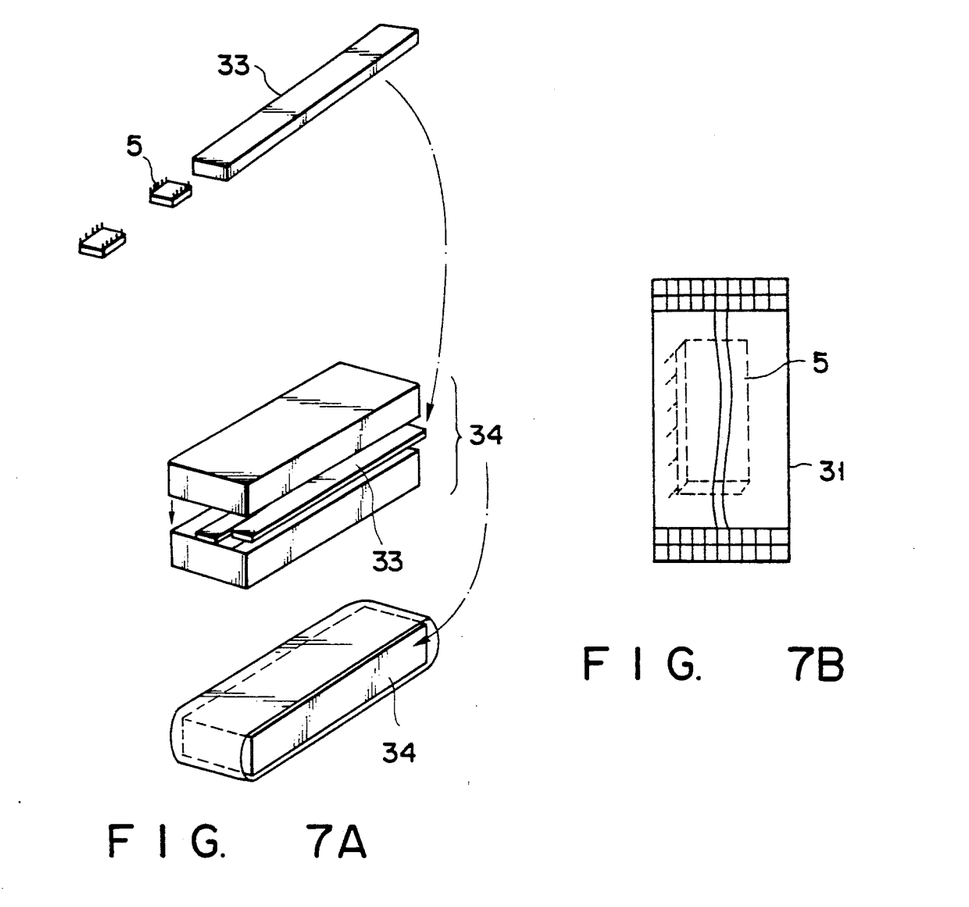
FIG. 7A is a view showing the case where the present invention is applied to a semiconductor device-wrapping member of a magazine type.
FIG. 7B illustrates the case where the present invention is applied to the wrapping of one semiconductor devices.

The present invention is not limited to the tape members mentioned above. As is shown in FIG. 7A, the present invention may be embodied as a magazine type wrapping member. In FIG. 7A, reference numeral 33 denotes a tubular member for holding a plurality of semiconductor devices 5 therein. Member 33 is usually formed of an organic material, such as plastics. As can be understood from the sectional view shown in FIG. 7C, member 33 has thin metallic film 36 on its surfaces, so that it produces substantially similar technical advantages as mentioned above Usually, member 33 is stored in container 34. If this container also has a laminated aluminum film on its surfaces, semiconductor devices 5 can be protected further reliably.

Figures 7C, 7D:
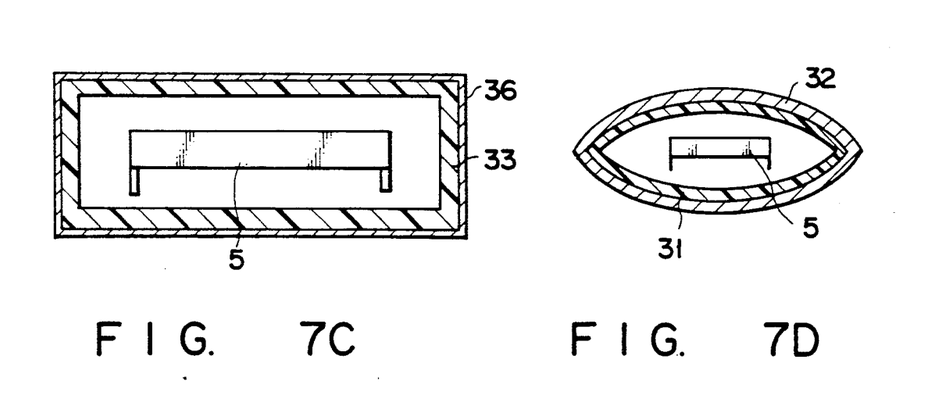
FIGS. 7C and 7D are sectional views of the embodiment shown in FIGS. 7A and 7B.

As is shown in FIGS. 7B and 7D, the present invention may be embodied as a wrapping member used for wrapping a single semiconductor device. This embodiment ensures satisfactory moisture resistance though the cost associated with the embodiment is comparatively high.

Figure 8A:
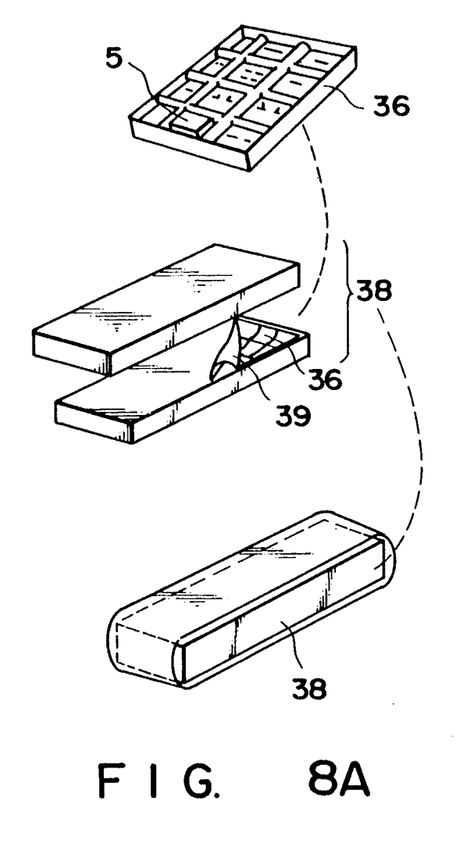
FIG. 8A is a view showing the case where the present invention is applied to a semiconductor device-wrapping member of a tray type.
Figure 8B:
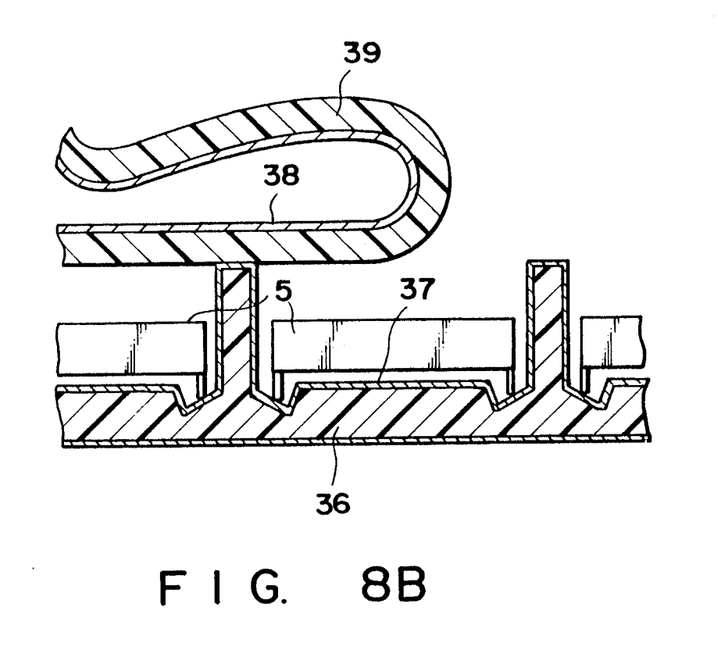
FIG. 8B is a sectional view of the embodiment shown in FIG. 8A.

As is shown in FIGS. 8A and 8B, the present invention may be embodied as a tray type wrapping for wrapping semiconductor devices. Referring to FIGS. 8A and 8B, reference numeral 36 denotes a box-like semiconductor device-wrapping member of a tray type. After disposing semiconductor devices, wrapping member 36 is covered with seal tape 39. Since a laminated film is formed on the surfaces of member 36 and seal tape 39, the technical advantages as mentioned above are produced.

A description will now be made as to how the wrapping members according to the present invention is manufactured. Roughly speaking, the wrapping member is manufactured by use of one of the following two methods. In the first method, a thin metallic film is formed on an organic material (which is usually plastics), and then the organic material is molded into a predetermined shape. In the second method, the organic material is first molded into the predetermined shape and then the thin metallic film is formed on the molded organic material.

Figure 4:
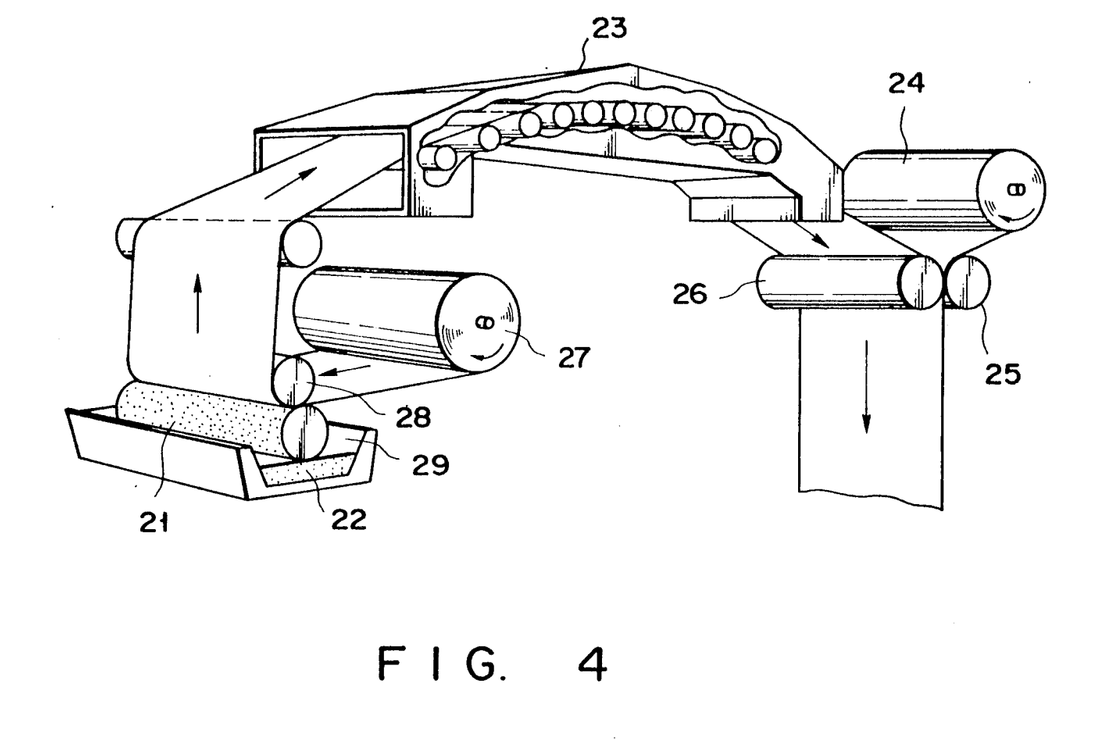
FIG. 4 is a perspective view of an apparatus for manufacturing the tape member of the embodiments.

The first method is exemplified by a dry laminating method, wherein a thin film-forming apparatus such as that shown in FIG. 4 is employed. In FIG. 4, reference numeral 21 denotes a photogravule roll; 22, an adhesive; 23, a dry zone; 24, a plastic film, an aluminum foil, a copper foil, or the like; 25, a steel roll; 26, a rubber roll; and 27, a plastic film, an aluminum foil, a copper foil, or the like. An organic material having a thin metallic film formed by use of the above apparatus is molded in a well-known fashion, so as to manufacture wrapping members of the present invention.

Figure 9:
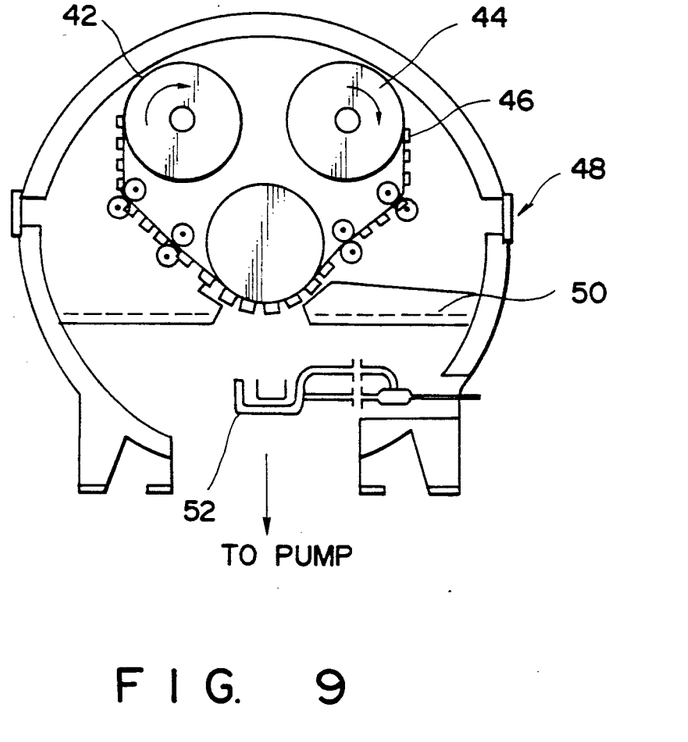
FIG. 9 is a schematic illustration of an apparatus for forming a thin metallic film employed in the present invention.

The second method uses a semi-successive deposition apparatus, such as that shown in FIG. 9, so as to form a thin metallic film on the surface of molded plastics material 46. In FIG. 9, reference numeral 42 denotes a take-up shaft; 44, a feeding shaft; 46, an embossed tape; 48, an observation window; 50, a partitioning plate; and 52, a vapor source. By use of this apparatus, a thin metallic film can be formed on the surfaces of plastic material 46 which is molded beforehand.

The thin metallic film is usually formed of aluminum but is not limited to this. Any metal, such as copper, may be used as long as it provides moisture resistance.

In the tape member of the present invention, a laminated metallic film is formed on at least one of the carrier tape and the seal tape. With this construction, the tape member eliminates the problems arising from moisture absorption, has sufficient mechanical strength, and can be used in any environment without requiring a backing operation on the part of the user. Wrapping members of other forms enjoy similar technical advantages if only a thin metallic film is formed on them in a similar manner to that mentioned above.

What is claimed is:

1. A method for manufacturing a wrapping member for holding semiconductor devices, comprising:
    a step for molding an organic material into a carrier tape embossed to form depressed portions for holding semiconductor devices and having a carbon-containing plastic body;
    a step of forming a thin metallic film on said plastic body;
    a step of forming an organic material into a seal tape for adhering to the carrier tape in a manner which successively covers the depressed portions; and
    a step of forming a thin metallic film on said seal tape.

* * * * *